United States Patent

Egerton, Jr.

[15] 3,696,407

[45] Oct. 3, 1972

[54] DIGITAL TO SYNCHRO CONVERTER

[72] Inventor: McKenny W. Egerton, Jr., Owings Mills, Md.

[73] Assignee: The Bendix Corporation, Southfield, Mich.

[22] Filed: Aug. 21, 1969

[21] Appl. No.: 851,794

[52] U.S. Cl. ........................................... 340/347 SY
[51] Int. Cl. ........................................... H03k 13/02
[58] Field of Search .........340/347, 347 DA, 347 SY; 235/150.5, 92, 154, 186

[56] References Cited

UNITED STATES PATENTS 3,375,513 3/1968 Elbling ................340/347 DA
2,849,668 8/1958 Tripp ..................340/347 UX
3,456,253 7/1969 Vainer et al. ..............340/347
3,471,851 10/1969 MacTaggart ..............340/347
3,509,556 4/1970 Schmidt.....................340/347

*Primary Examiner*—Maynard R. Wilbur
*Assistant Examiner*—Leo H. Boudreau
*Attorney*—Plante, Arens, Hartz, Smith & Thompson

[57] ABSTRACT

Disclosed is a D to S converter for converting a binary input digital code to an analog output suitable for driving a synchro or resolver. The encoder comprises a plurality of electronic angle vector rotators including cross coupled sine and cosine channels for modifying the input to each stage by an amount equal to plus or minus a known angle. Each stage produces rotation by half the angle of the previous stage. The converter includes a first stage forming a quadrant selector and angle rotation for bits of lesser significance are approximated by a resistance ladder linear interpolator. The output drives a resolver directly or passes through a Scott transformation stage for application to the windings of a synchro.

16 Claims, 4 Drawing Figures

PATENTED OCT 3 1972 3,696,407

SHEET 1 OF 3

INVENTOR

McKENNY W. EGERTON, JR.

BY Le Blanc & Shur

ATTORNEYS

INVENTOR
McKENNY W. EGERTON, JR.

BY LeBlanc & Shur

ATTORNEYS

INVENTOR
McKENNY W. EGERTON, JR.

BY Le Blanc & Shur

ATTORNEYS

DIGITAL TO SYNCHRO CONVERTER

This invention relates to digital to analog converters and more particularly to a simplified converter for converting a digital input signal into an analog output suitable for driving the shaft of a resolver or synchro. The converter of the present invention is completely electronic in nature and can be constructed to produce an output within the resolution of the system which does not involve any trigonometric approximation.

There is disclosed in assignee's copending U.S. application Ser. No. 588,408, filed Oct. 21, 1966, now U.S. Pat. No. 3,555,541, an electronic angle encoder and angle signal modifier for operating on an analog signal to produce a digital output indicative of a rotated angle. The angle encoder of that application involves no trigonometric approximation and produces a high speed, accurate digital output signal according to a successive approximation technique which is truly representative of the shaft angle of a resolver or synchro coupled to the input of the encoder.

The present invention is directed to an electronic angle signal modifying or rotating device of the same general construction as that disclosed and claimed in the above pending application and more particularly is related to a simplified angle signal modifier that is particularly adapted for digital to analog conversion. In the encoder of the present invention, the digital input signal is applied to successive serially arranged encoding stages in parallel to produce output signals on the encoder sine and cosine leads having an analog value indicative of the digital input code. The sine and cosine signals may be combined in a well known manner to operate a conventional resolver or alternatively they may be passed through a Scott transformation stage to produce a signal suitable for driving the three windings of a conventional synchro. Each stage of the converter comprises a pair of operational amplifiers cross coupled through a pair of transistor switches which amplifiers comprise portions of respective sine and cosine channels in the converter. Operation of the transistor switches in response to the digital input code operates to couple a portion of the signal in one channel to the other channel with proper polarity, and having a magnitude which is a function of the tangent of a predetermined angle through which the signal is to be rotated or modified.

The converter of the present invention can be constructed to produce an output which is exact and involves no trigonometric approximations, to the desired resolution depending upon the number of stages of the converter. Alternatively, a feature of the present invention includes the incorporation in the converter of a novel linear interpolator for producing signals in the later stages of the converter representing the least significant bits of the input code. That is, for angle changes that are very small, the angle is approximately equal to its tangent, and this approximation may be incorporated in the lesser significant bit stages of the converter to produce a simplified and less expensive circuit construction. Additional features of the present invention include a simplified arrangement for electronically cross coupling signals between the sine and cosine channels and the provision of an electronic Scott transformation stage for coupling the converter output to the three windings of a conventional synchro. The complete converter construction including the digital input logic for the input signal is completely electronic and may be fabricated utilizing conventional integrated circuit techniques.

It is therefore one object of the present invention to provide an improved digital to resolver or synchro converter.

Another object of the present invention is to provide a digital to synchro converter which may be constructed to produce an output which involves no trigonometric approximation.

Another object of the present invention is to provide a fully electronic digital to synchro converter which may be constructed from integrated circuit components.

Another object of the present invention is to provide an electronic converter incorporating improved and simplified circuitry for cross coupling signals between the sine and cosine channels of the converter.

Another object of the present invention is to provide digital to synchro converter including an electronic linear interpolator for performing the later stages of conversion in the system for the bits in the input code of lesser significance.

Another object of the present invention is to provide an encoder which operates according to a plus-minus code and is capable of discreet or continuous conversion and which may be used to convert either DC or alternating current signals.

Another object of the invention is to provide an improved and simplified electronic angle vector rotator.

These and further objects and advantages of the invention will be more apparent upon reference to the following specification, claims and appended drawings therein.

Figure 1:
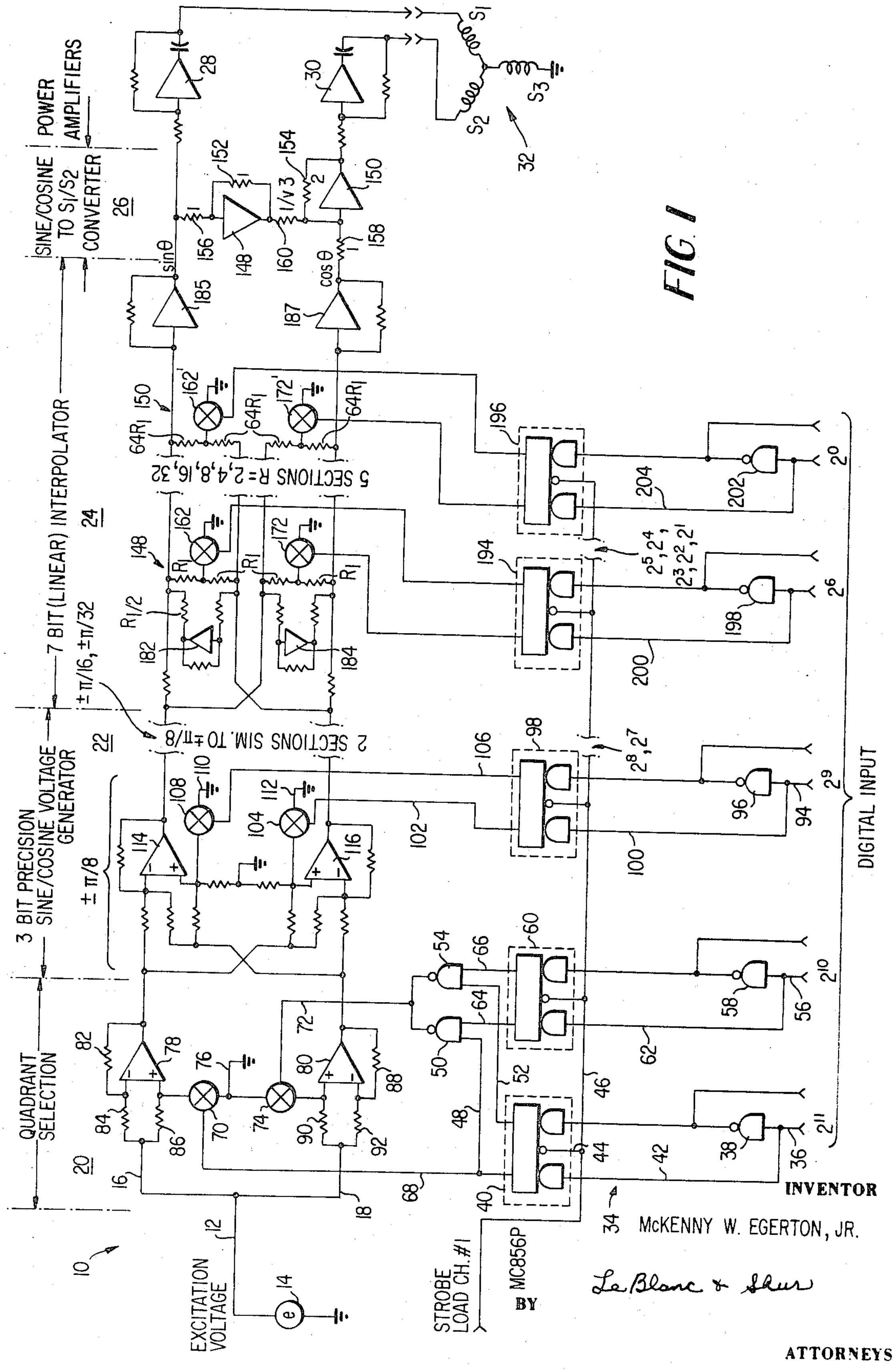
FIG. 1 is an overall circuit diagram of a digital to synchro converter constructed in accordance with the present invention.

Referring to the drawings, FIG. 1 is a circuit diagram of an overall converter constructed in accordance with the present invention and generally indicated at 10. The converter is illustrated as connected by lead 12 to a suitable excitation voltage source 14 which by way of example only may be a sinesoidal source operating at 400 Hz. The converter may be directly coupled to source 14 by way of lead 12 or alternatively if isolation is desired the converter may be coupled to the source through a conventional isolation transformer. The converter comprises a pair of channels including a sine channel generally indicated at 16 and cosine channel indicated at 18 which pass through a quadrant selection stage generally indicated at 20. From the quadrant selection stage, the sine and cosine channels pass through three stages forming a voltage generator generally indicated at 22 which are in turn coupled to a 7-bit or 7-stage linear interpolator 24. The two output signals from the linear interpolator are representative of sine $\phi$ and cosine $\phi$ respectively where $\phi$ is the angle represented by the digital input code. These signals may be used to drive a conventional resolver. However, FIG. 1 shows these signals passed through a Scott transformation converter 26 and through respective power amplifiers 28 and 30 for coupling to the three windings S1, S2, and S3 of a synchro generally indicated at 32. The digital input signals are supplied to the converter through a digital input logic circuit generally indicated at 34.

The first stage 20 of the converter receives the first two bits of the input code which are the most significant bits and from these two bits determines the 90° quadrant in which the angle represented by the input code lies. The input code is in straight binary form and the most significant digit is applied by way of lead 36 through an inverter 38 to one input of an integrated circuit flip-flop indicated by the dashed box 40. By way of example only, flip-flop 40 as well as the other corresponding flip-flops in the logic circuit 34 may be of the type manufactured by the Motorola Corporation and identified as integrated circuit MC 865P. The most significant bit of the digital input is directly coupled by way of lead 42 to the other input of flip-flop 40. Also connected to the flip-flops is a strobe lead 44 coupled to a strobe bus 46 which supplies a strobe signal from a suitable source to all the flip-flops of the input logic circuit 34. One output of the flip-flop 40 is connected by lead 48 to one input of a NOR gate 50. The other output of flip-flop 40 is connected by lead 52 to an input of a second NOR gate 54.

Similarly the second most significant bit of the binary input signal is applied by way of lead 56 through an inverter 58 to one input of integrated circuit flip-flop 60 in all respects identical to the flip-flop 40 previously described. The second most significant bit is also applied directly over lead 62 to the other flip-flop input. One output of flip-flop 60 is connected by lead 64 to the other input of NOR gate 50 while the other output of flip-flop 60 is connected by lead 66 to the second input of NOR gate 54.

The output of flip-flop 40 appearing on lead 48 is also applied by way of a lead 68 to the input of a transistor switch 70. The outputs of NOR gates 50 and 54 are connected together and coupled by way of lead 72 to a second transistor switch 74. Each of the switches 70 and 74 have one side connected to ground as at 76 whereas the other side of switch 70 is connected to an operational amplifier 78 in sine channel 16 and the other side of switch 74 is connected to an operational amplifier 80 in the cosine channel 18. OPerational amplifier 78 is provided with a feedback resistor 82 and with a pair of input resistors 84 and 86, the former being connected to the negative or inverting input of the amplifier and the latter resistor 86 being coupled to the positive or non-inverting input of the amplifier. Similarly, amplifier 80 is provided with a feedback resistor 88 and input resistors 90 and 92 connected to the non-inverting and inverting input terminals of the amplifier respectively.

In the embodiment illustrated, the converter 10 takes the form of a 12-bit converter and the third most significant bit or the $2^9$ bit is connected by a lead 94, through inverter 96 to one input of an integrated circuit flip-flop 98 in all respects identical to the flip-flops 40 and 60. The third most significant bit is applied directly by lead 100 to the other input of the flip-flop 98. One output of the flip-flop is applied by lead 102 to a transistor switch 104 and the other side of the flip-flop output is connected by a lead 106 to a second transistor switch 108. One side of switch 108 is grounded as at 110 as is one side of switch 104 at 112. The other side of switch 108 is connected to an operational amplifier 114 in the sine channel forming a part of the voltage generator 22 and the other side of corresponding switch 104 is connected to an operational amplifier 116 in the cosine channel. Only a single generator stage is illustrated in FIG. 1, but in the preferred embodiment the generator comprises three stages as more thoroughly illustrated in FIG. 2. The $2^8$ and $2^7$ bits are supplied through inverters and flip-flops to the switches of the second and third stages of the generator 22 in the same manner as the $2^9$ bit is applied to the first stage as illustrated in FIG. 1.

Figure 2:
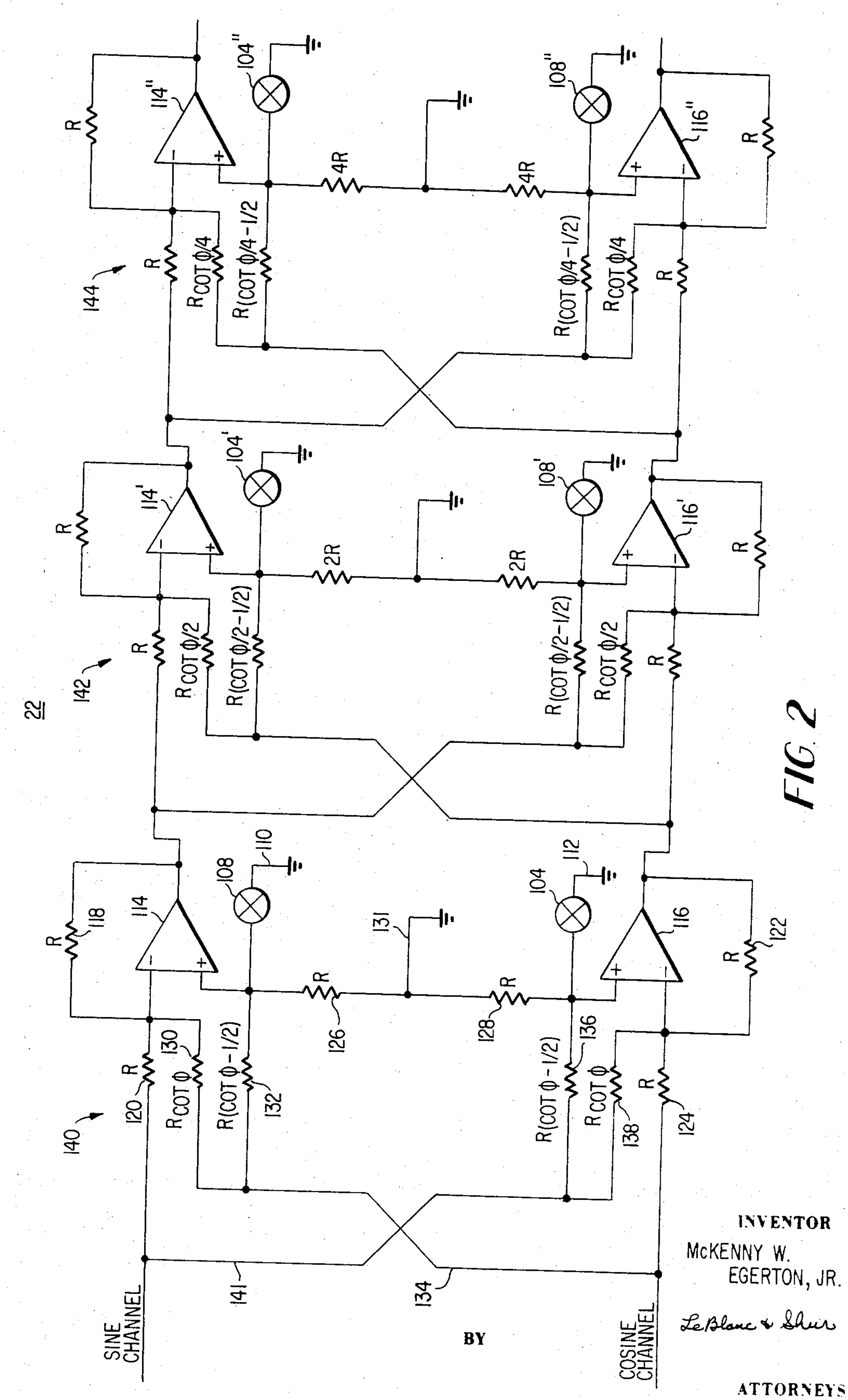
FIG. 2 is a circuit diagram of a three bit precision sine/cosine voltage generator forming a portion of the converter of FIG. 1.

Referring to FIG. 2, operational amplifier 114 in the sine channel is provided with a feedback resistor 118 and an input resistor 120 coupled to the negative or inverting input terminal of amplifier 114. Amplifier 116 in the cosine channel is similarly provided with a feedback resistor 122 and an input resistor 124 connected to the inverting input terminal of the amplifier. The non-inverting input terminals of the amplifiers are connected to the respective switches 108 and 104 and through respective resistors 126 and 128 to ground as indicated at 131.

Cross coupling between channels is completed by a pair of input resistors 130 and 132 connected from the cosine channel by way of lead 134 to the respective inputs of operational amplifier 114 in the sine channel and by way of input resistors 136 and 138 connected from the sine channel by way of lead 141 to the respective inputs of operational amplifier 116 in the cosine channel. The first stage 140 of the voltage generator 22 is repeated in the second stage 142 and the third stage 144 these latter two stages being identical in all respects to the first stage except for the values of the resistors as indicated in the drawing of FIG. 2. For this reason, a detailed description of the second and third stage is deemed unnecessary, it being understood that the second stage 142 receives an input to the switches 104' and 108' from the fourth most significant bit or the $2^8$ bit of the input code. Similarly switches 104'' and 108'' receive an input from the $2^7$ bit of the input code. The corresponding cross coupling resistors in the second stage have half the angle value of the resistors in the first stage and those in the third stage have one-fourth the angle value of the first stage, i.e., the resistors of the three successive stages are representative of binarily related smaller angle.

Figures 3, 4:
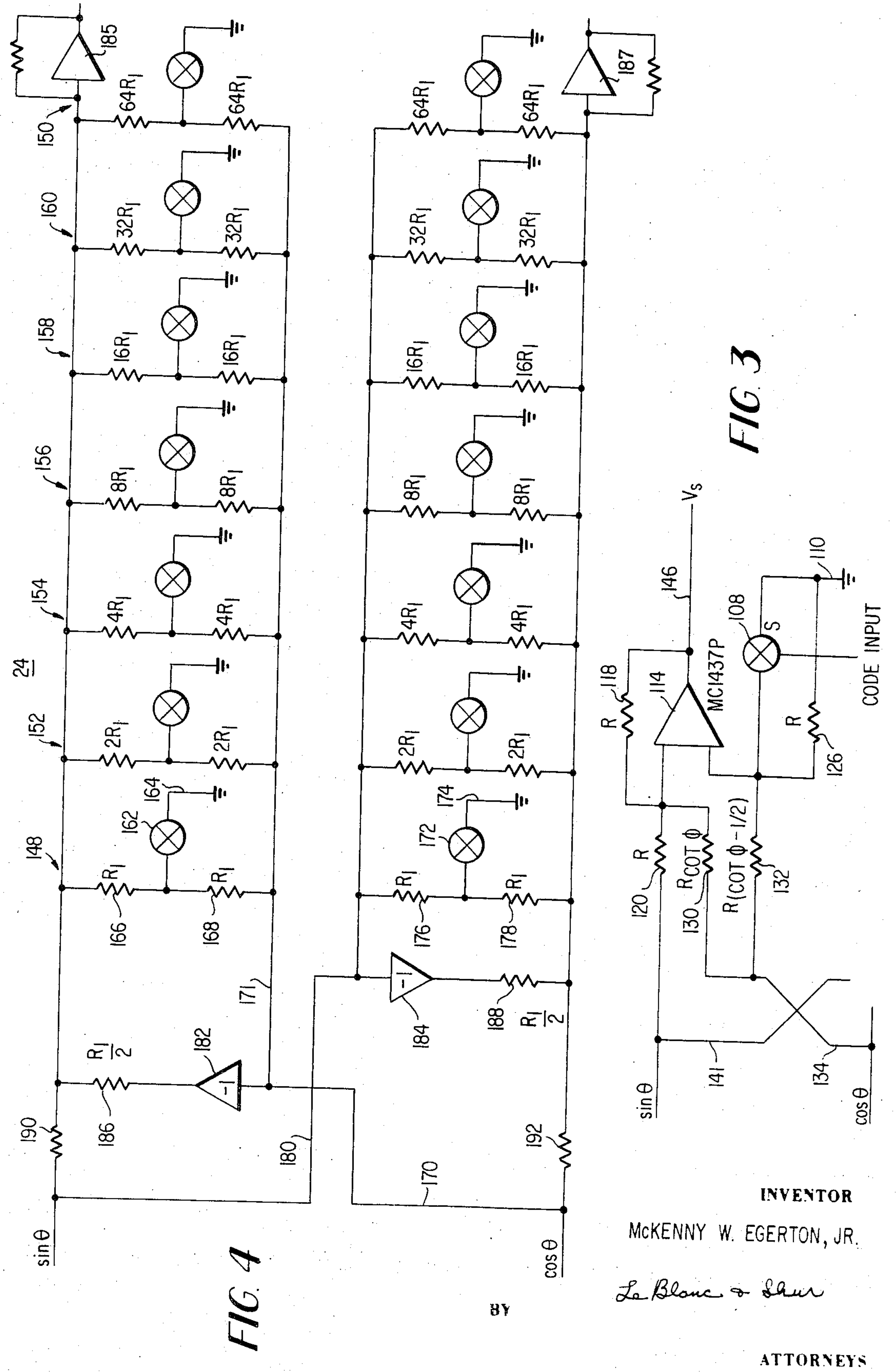
FIG. 3 is a diagram of a portion of one of the stages of the voltage generator of FIGS. 1 and 2 forming an electronic angle vector rotator.
FIG. 4 is a circuit diagram of a seven bit linear interpolator forming a portion of the converter of FIG. 1.

FIG. 3 is a diagram of the sine portion of the first stage 140 of the voltage generator 22 of FIG. 2 and is provided for the purpose of explanation. Voltages corresponding to sine $\theta$ and cosine $\theta$ (where $\theta$ is the reference angle of excitation source 14) appear on the two input leads to the voltage generator and the sine channel output is developed on output lead 146 as the voltage $V_s$ which is applied to the sine channel of the next succeeding stage. The operation of the voltage generator is based upon the following trigonometric identities given below as Equation (1).

$$\text{Sec}\,\phi \sin(\theta-\phi)=\sin\theta-\tan\theta\cos\theta$$

Sec $\phi$ cosin $(\theta-\phi)$ = cosin $\theta$ + tan $\phi$ sin $\theta$ (1)

These identities define an angle signal vector rotator or modifier in which $\theta$ is the original or reference angle and $\phi$ is a known angle through which the original angle is rotated. These indentities may be readily derived from the following perhaps better known identities appearing in almost every textbook on trigonometry.

Equation (2):

Sin $(\theta-\phi)$ = sin $\theta$ cosin $\phi$ − cosin $\theta$ sin $\phi$

Cosin $(\theta-\phi)$ = cosin $\theta$ cosin $\phi$ + sin $\theta$ sin $\phi$ (2)

In order to produce an electrical change of the original angle $\theta$ by $(-\phi)°$ it is necessary to subtract tangent $\phi$ cosine $\theta$ from sine $\theta$ and at the same time add tangent $\phi$ sine $\theta$ to cosine $\theta$. The converse is true for changes of $(+\phi)°$. The secant $\phi$ terms in Equation (1) constitute proportionality factors which while affecting the magnitude of the signals at various stages of the encoding process are canceled out in the final ratio $$\tan(\theta\pm\phi)=\frac{\sin(\theta\pm\phi)}{\cos(\theta\pm\phi)}$$

The secant term does not change sign for angles of 45° and less. The secant $\phi$ term is always a positive quantity and varies between 1 and $\sqrt{2}$ for angles of 0° to 45°. Thus, while this term affects the amplitude of the signals it does not change their signs or ratio and therefore does not affect the output of the encoding process.

If the voltages and resistances in FIG. 3 are normalized the output voltage can be shown to be:

$V_s=-(\sin\theta\pm\tan\phi\cos\theta)$ (3)

where the ± sign is positive if the switch 108 labeled S is open and negative if switch 108 is closed. Similarly the corresponding output voltage of the lower or cosine channel is:

$V_c=-(\cos\theta\pm\tan\phi\sin\theta)$. (4)

The ratio of these two voltages may be taken to represent the tangent of a new angle $\phi'$ where:

$$\tan\phi'=\frac{V_s}{V_c}=\frac{\sin\theta\cos\phi\pm\cos\theta\sin\phi}{\cos\theta\cos\phi\mp\sin\theta\sin\phi}=\tan(\theta\pm\phi) \quad (5)$$

More specifically referring to FIG. 3, assume that the resistance of resistors 118, 120 and 126 equals unity. When switch 108 is closed the voltage $V_s$ is given by the equation:

$$V_s=-\left(\sin\theta+\frac{1}{R_{130}}\cos\theta\right) \quad (6)$$

When switch 108 is open, the output voltage $V_s$ on lead 146 is given by the equation:

$$V_s=-\left(\sin\theta-\frac{2R_{130}-R_{132}}{R_{130}(1+R_{132})}\cos\theta\right) \quad (7)$$

It can be seen that with $R_{130}=\cot\phi$ and $$R_{132}=\frac{2R_{130}-1}{2}$$

then for the circuit of FIG. 3 $V_s=-(\sin\theta\pm\tan\phi\cos\theta)$ and similarly for the cosine channel, the cosine output voltage is $V_c=-(\cos\theta\pm\tan\phi\sin\theta)$.

In operation the circuit of FIG. 1 represents one channel of a digital to synchro system which consists of ten identical digital to synchro channels. The other nine channels (not shown) are entirely independent of channel 1 illustrated but are of identical construction except that all channels use a common power supply and a common data input lines and each is capable of driving two size 11 torque receivers when supplied with 12 bit parallel binary data. Input data is loaded by activating the appropriate strobe bus. The two most significant bits contain quadrant information and therefore are used to control, as shown, the polarities of the 400 Hz sine and cosine voltages derived from the reference input source 14. These reference voltages described the 45° vector in the specified quadrant.

After the quadrant bits have determined the relative polarities of the sine and cosine voltages, i.e., the 45° vector, the voltages are applied to a series of amplifier stages in generator 22 which serve as successive binary vector rotaters. Each amplifier stage is controlled by one of the succeeding three bits of the input code and operates on the original input voltage in a mathematically exact manner so that the output voltages describe a new vector rotated successively ± 22.5°, ± 11.25°, and ± 5.625° from the 45° reference point.

The chain of stages 140, 142, and 144 in FIG. 2 provide successive values of vector rotation equal to $\pm(\pi/8, \pm(\pi/16)$, and $\pm(\pi/32)$, respectively. A chain of these circuits with successive values of $\phi$ equal to $\pm(\pi/a0), \pm(\pi/16) \ldots \pm(\pi/2^{n-1}), \pi/2^n$ can be provided in the circuit of FIG. 1 to exactly convert an angle represented by a binary code to a pair of voltages whose ratio is the tangent of the angle described by the code.

The final sine and cosine voltages are applied through a Scott transformer stage 26 to develop the required sin $\theta$ and − sin($\theta$+ 120°) or $S_2 - S_3$ voltages. This stage comprises a pair of operational amplifiers 148 and 150 having respective feedback resistors 152 and 154 and input resistors 156 and 158. The output of amplifier 148 is coupled to the input of amplifier 150 by a resistor 160 and the various resistors are related in value by factors 1, 2, and $1/\sqrt{3}$ as indicated on the drawing in FIG. 1. From the Scott transformation stage, the voltages are raised to synchro levels by the power transformers 28 and 30 and are direct coupled to the $S_1$ and $S_2$ windings of synchro 32.

As previously mentioned, all of the bits in the input code can be encoded by the quadrant selection stage 20 and the voltage generator stage 22 to the desired resolution. However, the preferred embodiment illustrated in FIG. 1 in the interest of circuit economy includes a linear interpolator 24 in the form of a binary weighted resistance ladder used to approximate the same result for the seven least significant bits of the 12-bit code. The trignometric approximation used for the interpolator 24 is that the tangent of a small angle (in this case, $\pi/64$) is equal to the angle, and the resulting error as a fraction of a resolution element is about $$\left(\frac{\pi}{2^7}\right)^3\times\frac{2^{12}}{2\pi}\approx .01$$

times the least significant bit, which is entirely negligible.

In FIG. 1, only the first and last stages 148 and 150 of the interpolator are shown but the entire interpolator 24 is illustrated in FIG. 4. That figure illustrates the additional five intermediate stages 152, 154, 156, 158, and 160 of the ladder network and the current summing amplifiers 185 and 187 terminating the interpolator. The successive stages of the interpolator are all identical in construction with the exception of the resistance values which are binarily related in the manner illustrated in FIG. 4. In view of their similarity, only the construction of the first stage 148 will be described in detail. The first stage comprises a sine channel transistor switch 162 having one side connected to ground as at 164 and its other side connected to the junction of a pair of resistors 166 and 168. When the switch is open, a cosine component is coupled to the sine channel by way of leads 170 and 171 passing through resistors 166 and 168.

Similarly, the first stage includes a second transistor switch 172 in the cosine channel having one side connected to ground as at 174 and its other side connected to the junction of resistors 176 and 178. In both the sine and cosine channels, when the switches 162 and 172 are closed the cross coupling component through the associated ladder resistors is shunted by the switch to ground and the cross coupling through the ladder resistor is not effected.

Connected across the input of the interpolator are a pair of operational amplifiers 182 and 184 which act as inverters, the former cross coupling a component from the cosine channel to the sine channel and latter cross coupling a component from the sine channel to the cosine channel. Inverter 182 is connected by way of lead 170 and output resistor 186 from the cosine channel to the sine channel. Inverter 184 is connected by lead 180 in FIG. 4 and output resistor 188 from the sine channel to the cosine channel. The amplifier output resistances are equal to one-half the value of the resistors $R_1$ of the first stage of the interpolator ladder. In all the succeeding stages, the ladder resistance values are binarily related as illustrated in FIG. 4. The cross coupling voltages are developed across the respective series resistors 190 and 192 in the sine and cosine channels respectively and the currents are summed by amplifiers 185 and 187.

In FIG. 1, switches 162 and 172 of the first stage of the interpolator are shown as connected to the outputs of integrated circuit flip-flop 194 and the corresponding switches 162' and 172' of the last stage of the interpolator are coupled to the outputs of the integrated circuit flip-flop 196, these flip-flops being in all respects identical to the flip-flops previously described. One input of flip-flop 194 is connected to the $2^6$ bit of the input code through inverter 198, while the other side of the flip-flop is connected to the input bit directly by way of lead 200. Similarly, the least significant bit, i.e., the $2^0$ bit, is connected to flip-flop 196 through inverter 202 and directly by way of lead 204. It is understood that the five intermediate stages of the interpolator 24 are similarly connected to the input code so that the $2^5$ bit actuates the transistor switches of the second stage, the $2^4$ bit the switches of the third stage, the $2^3$ bit the switches of the fourth stage, the $2^2$ bit the switches of the fifth stage, and the $2^1$ bit the switches of the sixth stage of the interpolator.

As is apparent from FIG. 1, all stages of the voltage generator 22 and of the interpolator 24 have corresponding switches in the sine and cosine channels connected to the opposite outputs of the same flip-flop. Thus, the two switches of each stage are in a sense ganged in that when one switch of a stage is turned on, the opposite switch of that stage is turned off since it is connected to the opposite flip-flop output. The only exception to this is the first stage of the inverter forming the quadrant stage 20 which has its switches 70 through 74 connected through suitable NOR logic circuitry to perform the quadrant selection by determining the sign of sin $\phi$ and cosine $\phi$.

It is apparent from the above that the present invention provides an improved date converter and particularly one suited for converting signals from a digital input code to a resolver or synchro driver output. In the preferred embodiment illustrated in FIG. 1, the encoder takes a form suitable for use with intergrated circuit modular units for converting parallel straight binary input codes representing a shaft angle to from 60 to 400 Hz synchro/resolver output voltages. The input circuits permit either direct or transformer coupling and can drive from one to six size 11 TR synchros. The converter can be assembled in rack housing so that any desired number of channels may be provided. The circuit provides up to 12 bits for a single speed synchro with the input code in the form of parallel straight binary bits. The circuitry operates between binary levels of 0 to +5 volts. The unit can convert twelve bits of input code with an accuracy of ±0.1° which accuracy includes drifts due to all causes and is operable over temperature ranges of 0° to 50° C. or greater.

Important features of the present invention include the provision of a simplified cross coupling arrangement which makes possible an all-electronic converter particularly adapted for use with integrated circuits. The converter operates on a plus-minus code so that the signals may swing in either a positive or negative direction to add or subtract angles, thus significantly increasing the coding speed. Furthermore, while described in conjunction with digital to analog conversion, the precision sine-cosine voltage generator 22 is inherently reversible so that the basic system is suitable for not only D to A conversion, i.e., digital to synchro, but also A to D, i.e., synchro to digital. Alternatively, the D to S converter of FIG. 1 may be incorporated in a conventional feedback counter circuit to perform synchro to digital conversion in a well known manner. By incorporating a linear ladder interpolator for the digits of lesser significance, it is possible to construct an economical and simplified circuit having a minimum of amplifiers. The output of the converter may be used directly to drive a conventional resolver or may be passed through a conventional Scott transformer or through the Scott transformation stage 26 to drive a conventional synchro.

What is claimed and desired to be secured by United States Letters Patent is:

1. A digital to analog converter comprising sine and cosine channels, means for impressing a reference voltage on both said sine and cosine channels, a vector rotator comprised of a plurality of electronic vector rotator stages coupled to said channels for producing an output from said sine channel representative of the sine of a known angle and from said cosine channel an output representative of the cosine of a known angle, each stage of said rotator including means for cross coupling to respective channels signals representative of either positive or negative quantities of the signal in the other channel, the cross coupled quantities of successive stages being related in accordance with the tangent of a binarily decreasing angle, and means coupled to said successive stages for applying to them the successive bits of a digital input code wherein each stage of said vector rotator comprises an operational amplifier in each channel having an inverting input and a non-inverting input, and means for cross coupling a signal from each channel to both the inverting and non-inverting inputs of the amplifier in the other channel.

2. A converter according to claim 1 including a switch coupled to each amplifier, said switch when closed acting to short out a corresponding input of its respective amplifier, means coupling an input bit to the switch of one channel, and means coupling the input bit complement to the switch in the other channel of the rotator stage.

3. A converter according to claim 2 wherein said switches couple the respective non-inverting inputs of said amplifiers to system ground.

4. A digital to analog converter comprising sine and cosine channels, means for impressing a reference voltage on both said sine and cosine channels, a quadrant selection stage forming a part of each of said channels, means coupled to said quadrant selection stage for applying to it the two most significant bits of an input binary code representative of an angle of from 0° to 360°, a plurality of electronic vector rotator stages coupled to said quadrant selection stage for producing an analog output from said sine channel representative of the sine of said angle and from said cosine channel an analog output representative of the cosine of said angle, each stage of said rotator including means for cross coupling to respective channels signals representative of either positive or negative quantities of the signal in the other channel, the cross coupled quantities in the successive rotator stages being related in accordance with the tangent of a binarily decreasing angle, and means coupled to the successive stages of said vector rotator for applying to them corresponding successive remaining bits of said input code.

5. A converter according to claim 4 including a synchro coupled to receive the outputs from said sine and cosine channels of said converter.

6. A converter according to claim 5 including a Scott transformation device coupling said sine and cosine channels to said synchro.

7. A converter according to claim 6 wherein said Scott transformation device is a Scott transformation stage including a pair of operational amplifiers.

8. A converter according to claim 4 including a linear interpolator coupled to receive the sine and cosine signal outputs from the last stage of said vector rotator, said interpolator including a plurality of stages, and means coupled to the successive stages of said interpolator for applying to them corresponding successive bits of said code of lesser significance than are applied to said vector rotator stages.

9. A converter according to claim 8 wherein said interpolator comprises a resistance ladder network.

10. A converter according to claim 9 wherein said interpolator includes sine and cosine channels, and a pair of amplifiers cross coupled between said channels ahead of the first stage of said interpolator.

11. A converter according to claim 10 wherein each stage of said interpolator comprises a pair of sine channel resistors and a first switch coupled between the junction of said sine channel resistors and ground, and a pair of cosine channel resistors and a second switch coupled between the junction of said cosine channel resistors and ground, the resistors of successive interpolator stage being binarily related in value.

12. A converter according to claim 11 including a pair of current summing amplifiers terminating the sine and cosine channels of said interpolator.

13. An electronic angle vector rotator comprising sine and cosine channels, means for coupling a signal representative of sine $\theta$ to the input of said sine channel and representative of cosine $\theta$ to the input of said cosine channel, where $\theta$ is a first angle to be rotated through a second known angle $\phi$, an operational amplifier in each channel, each said amplifier having an inverting input coupled to receive said sine $\theta$ and cosine $\theta$ signals respectively and each having a non-inverting input, a first pair of resistors $R_1$ each coupling the input signal in one of said channels to the inverting input of the amplifier in the other channel, a second pair of resistors $R_2$ each coupling the input signal in one of said channels to the non-inverting input of the amplifier in the other channel, and a pair of switches coupling said non-inverting inputs to ground, said resistor having resistance values according to the relationship $R_1 = \cot \phi$ and $R_2 = \cot \phi - ½$.

14. An angle vector rotator according to claim 13 including a flip-flop, one output of said flip-flop being coupled to one of said switches and the other output being coupled to the other of said switches whereby said switches are ganged such that when one is open the other is closed.

15. An angle vector rotator according to claim 13 including a pair of input resistors R coupling said sine $\theta$ and cosine $\theta$ inputs to the inverting inputs of said amplifiers, said resistors having resistance values according to the relationships $R = R$, $R_1 = R \cot \phi$, and $R_2 = R(\cot \phi - ½)$.

16. An angle vector rotator according to claim 15 including a pair of feedback resistors for said amplifiers each having a resistance value R, and a resistor in parallel with each of said switches coupling the respective non-inverting amplifier inputs to ground, said parallel resistors each having a resistance value R.

* * * * *